(12) United States Patent
Borsari et al.

(10) Patent No.: US 9,093,266 B2
(45) Date of Patent: Jul. 28, 2015

(54) FORMING HIGH ASPECT RATIO ISOLATION STRUCTURES

(75) Inventors: Silvia Borsari, Milan (IT); Carla Maria Lazzari, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 13/083,836

(22) Filed: Apr. 11, 2011

(65) Prior Publication Data
US 2012/0256289 A1 Oct. 11, 2012

(51) Int. Cl.
| H01L 21/70 | (2006.01) |
| H01L 21/76 | (2006.01) |
| H01L 21/02 | (2006.01) |
| H01L 29/06 | (2006.01) |
| H01L 21/762 | (2006.01) |

(52) U.S. Cl.
CPC ...... *H01L 21/0228* (2013.01); *H01L 21/02112* (2013.01); *H01L 21/76232* (2013.01); *H01L 29/0649* (2013.01)

(58) Field of Classification Search
None
See application file for complete search history.

(56) References Cited

U.S. PATENT DOCUMENTS

| | | | | |
|---|---|---|---|---|
| 4,185,318 A * | 1/1980 | Engeler et al. | ................ | 365/183 |
| 4,884,123 A | 11/1989 | Dixit | | |
| 5,036,373 A * | 7/1991 | Yamazaki | ................ | 257/86 |
| 5,139,970 A * | 8/1992 | Yamazaki | ................ | 438/22 |
| 5,296,392 A * | 3/1994 | Grula et al. | ................ | 438/222 |
| 5,854,120 A * | 12/1998 | Urano et al. | ................ | 438/404 |
| 6,010,948 A * | 1/2000 | Yu et al. | ................ | 438/436 |
| 6,030,881 A * | 2/2000 | Papasouliotis et al. | ....... | 438/424 |
| 6,348,706 B1 * | 2/2002 | Sandhu | ................ | 257/296 |
| 6,740,601 B2 * | 5/2004 | Tan et al. | ................ | 438/771 |
| 6,867,444 B1 * | 3/2005 | Hughes | ................ | 257/252 |
| 6,890,833 B2 | 5/2005 | Belyansky | | |
| 7,052,997 B2 * | 5/2006 | Sandhu | ................ | 438/694 |
| 7,097,886 B2 * | 8/2006 | Moghadam et al. | .......... | 427/569 |
| 7,144,803 B2 * | 12/2006 | Engbrecht et al. | ............ | 438/622 |
| 7,154,136 B2 * | 12/2006 | Cole et al. | ................ | 257/292 |
| 7,271,092 B2 | 9/2007 | Agarwal | | |
| 7,399,679 B2 * | 7/2008 | Sheu et al. | ................ | 438/433 |
| 7,400,004 B2 * | 7/2008 | Cole et al. | ................ | 257/292 |

(Continued)

FOREIGN PATENT DOCUMENTS

JP 2000164523 A * 6/2000 ............ H01L 21/225

OTHER PUBLICATIONS

Shirai et al. Characterization of hydrogenated amorphous boron films prepared by electron cyclotron resonance plasma chemical vapor deposition method. May 15, 1990. J. Appl. Phys. vol. 67, No. 10, pp. 6286-6291.*

(Continued)

*Primary Examiner* — Hoang-Quan Ho
(74) *Attorney, Agent, or Firm* — Dorsey & Whitney LLP

(57) ABSTRACT

An isolation structure, such as a trench isolation structure, may be formed by forming an aperture in a semiconductor substrate and then filling the aperture with boron. In some embodiments, the aperture filling may use atomic layer deposition. In some cases, the boron may be amorphous boron. The aperture may be a high aspect ratio aperture, such as a trench, in some embodiments.

20 Claims, 4 Drawing Sheets

(56) References Cited

U.S. PATENT DOCUMENTS

| | | | |
|---|---|---|---|
| 7,534,691 B2* | 5/2009 | Cole et al. | 438/368 |
| 7,691,722 B2 | 4/2010 | Zhou | |
| 7,741,192 B2* | 6/2010 | Shimoyama et al. | 438/433 |
| 8,071,455 B2* | 12/2011 | Cole et al. | 438/368 |
| 8,119,496 B2* | 2/2012 | Shimoyama et al. | 438/433 |
| 8,193,094 B2* | 6/2012 | Wang | 438/692 |
| 8,337,950 B2* | 12/2012 | Nguyen et al. | 427/249.5 |
| 2003/0113999 A1* | 6/2003 | Jang et al. | 438/685 |
| 2004/0115898 A1* | 6/2004 | Moghadam et al. | 438/435 |
| 2004/0262669 A1* | 12/2004 | Shum et al. | 257/315 |
| 2006/0089002 A1* | 4/2006 | Sandhu | 438/694 |
| 2007/0128866 A1* | 6/2007 | Lee et al. | 438/680 |
| 2007/0212850 A1* | 9/2007 | Ingle et al. | 438/435 |
| 2009/0085123 A1* | 4/2009 | Sato | 257/369 |
| 2009/0203197 A1* | 8/2009 | Hanawa et al. | 438/513 |
| 2009/0243021 A1* | 10/2009 | Cole et al. | 257/446 |
| 2010/0093164 A1* | 4/2010 | Nakazawa et al. | 438/535 |
| 2010/0213380 A1* | 8/2010 | Kub et al. | 250/370.05 |
| 2010/0264455 A1* | 10/2010 | Nakazawa et al. | 257/139 |
| 2011/0095193 A1* | 4/2011 | Orava et al. | 250/370.05 |
| 2011/0159673 A1* | 6/2011 | Hanawa et al. | 438/558 |
| 2011/0207267 A1* | 8/2011 | Nakazawa et al. | 438/135 |
| 2011/0207329 A1* | 8/2011 | Shih et al. | 438/702 |
| 2011/0312180 A1* | 12/2011 | Wang | 438/692 |
| 2012/0121864 A1* | 5/2012 | Lazzari et al. | 428/172 |
| 2012/0256289 A1* | 10/2012 | Borsari et al. | 257/506 |

OTHER PUBLICATIONS

Shultis et al. Efficiencies of Coated and Perforated Semiconductor Neutron Detectors. IEEE Transactions on Nuclear Science. Jun. 2006. vol. 53. No. 3. pp. 1659-1665.*

Huang et al. Boron filling of high aspect ratio holes by chemical vapor deposition for solid-state neutron detector applications. Sep./Oct. 2012. J. Vac. Sci. Technolo. B vol. 30. No. 5. pp. 051204-1-051204-6.*

Nicholas LiCausi et al. A novel solid state self-powered neutron detector. Proc. SPIE 7079, Hard X-Ray, Gamma-Ray, and Neutron Detector Physics X, 707908 (Sep. 4, 2008). doi:10.1117/12.797036.*

Lamborn at al., Modeling studies of the chemical vapor deposition of boron films from B2H6, Journal of Crystal Growth, vol. 299, Nov. 2006, pp. 358-364.

Sarubbi et al., "Uniformity of Chemical Vapor Deposited Boron-Silicide Layers on Silicon", Laboratory of Electronic Components, Technology and Materials (ECTM), Delft Institute of Microelectronics and Submicron Technology (DIMES), Delft University of Technology, 2628 CT Delft, The Netherlands (email: sarubbi@dimes.tudelft.nl), Oct. 1, 2006.

Lazzari, Carla M., et al., "Forming Heaters for Phase Change Memories", U.S. Appl. No. 12/944,134, filed Nov. 10, 2010.

Rozenblat, Avraham, et al., "Barrier Layer for Integrated Circuit Contacts", U.S. Appl. No. 13/083,868, filed Apr. 11, 2011.

* cited by examiner

FORMING HIGH ASPECT RATIO ISOLATION STRUCTURES

BACKGROUND

This relates generally to isolation structures used in semiconductor devices.

Isolation structures are widely used in semiconductor devices. One general application is to isolate active areas from each other. In other cases, individual devices, rows of devices, or arrays of devices may need to be electrically isolated from other structures.

Conventionally, isolation structures may be formed by growing an oxide. For example, in field isolation regions, an oxide is grown to isolate substrate regions from one another.

In memory devices in particular, trench isolations are widely used. The trench isolation fabrication may begin by forming a trench and then depositing oxide, such as high density plasma (HDP) oxide, within the trench, in a step called trench filling. Both shallow trench isolations and deep trench isolations are known.

One problem with trench isolation structures is that voids may form in the filling process. The greater the aspect ratio of the trench, the more likely it is that voids may form. Voids may result in improper filling, and ineffective isolation.

DETAILED DESCRIPTION

In accordance with some embodiments, high aspect ratio apertures may be filled with boron as a trench filler material. Boron may be advantageous because amorphous boron is more resistive than oxides and, therefore, is a better insulator. In addition, boron may, in some embodiments, be less prone to forming voids. Finally, in some embodiments, boron may be effective in filling high aspect ratio trenches relative to oxide filling of such trenches.

As used herein, a substrate includes any semiconductor-based structure that has a semiconductor surface. A substrate includes silicon, silicon on insulator, silicon on sapphire, doped and undoped semiconductors, epitaxial layers of silicon supported by a base semiconductor foundation, combinations of semiconductors and dielectric, conducting, or metallic layers and any other semiconductor structures. The semiconductor substrate need not be silicon based, but could also be silicon germanium, germanium, or gallium arsenide, to mention additional examples.

As used herein, an aperture includes a via, an opening, a contact, a trench, or a hole. As used herein, a high aspect ratio aperture is an aperture having a ratio of depth to width greater than ten.

The apertures filled, in accordance with some embodiments of the present invention, may be used for shallow trench isolations, deep trench isolations, field isolations, or any isolation application where one area of a semiconductor substrate is isolated electrically from another area using a filled aperture. Generally, the isolations tend to reduce leakage currents between different areas of the substrate.

In accordance with some embodiments, the aperture is filled using an atomic layer deposition technique. However, the present invention is also applicable to forming boron filled aperture isolation structures, such as trench isolations, using other deposition techniques, including chemical vapor deposition.

Figure 1:
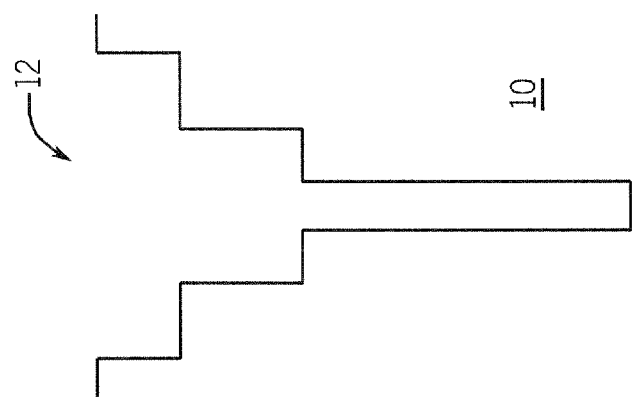
FIG. 1 is a greatly enlarged cross-section of an aperture to be filled in accordance with one embodiment of the present invention.

Referring to FIG. 1, a high aspect ratio aperture 12 may be formed in a semiconductor substrate 10. The aperture 12 is shown as having areas of different width, but any shape of aperture 12 may be utilized in other embodiments. The aperture 12 may be a high aspect ratio aperture, which may be relatively difficult to fill using conventional techniques. Preferably, the surface of the aperture is cleaned and is free of metals and dielectrics. However, in some embodiments, prior to deposition of the boron filler material, a barrier layer may be formed to prevent boron diffusion into surrounding structures. In other embodiments, an adhesion layer may be used, instead of or in addition to a barrier layer, to aid in adhesion of boron or the barrier layer.

Figure 2:
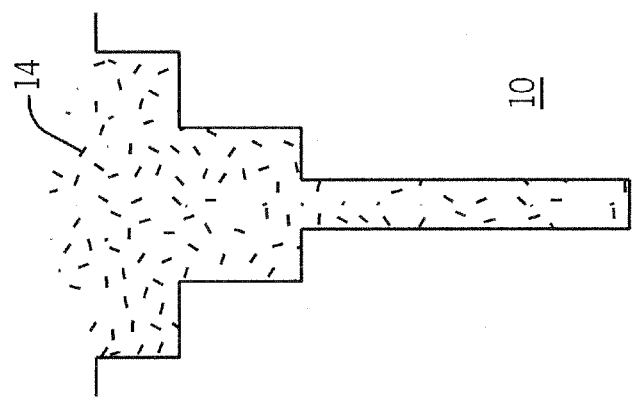
FIG. 2 is a greatly enlarged cross-section of a filling process in accordance with one embodiment.

Referring to FIG. 2, the deposition of boron may begin by exposing the trench to a flow of $B_2H_6$ or diborane 14. In accordance with one embodiment of the present invention, a flow of boron may proceed for 250 seconds at a pressure of 60 Torr with a flow rate of 440 SCCM. However, other deposition techniques may also be used.

Figure 3:
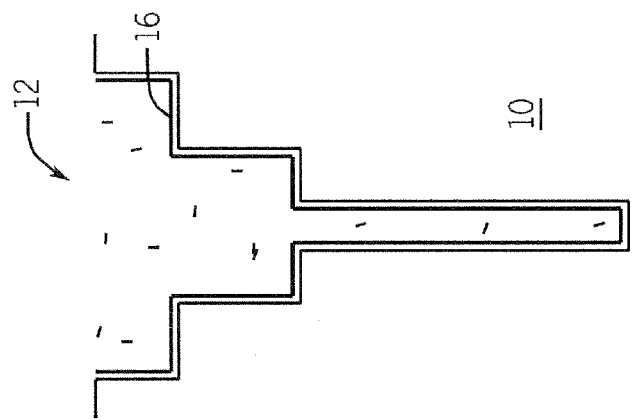
FIG. 3 is a greatly enlarged cross-section of a physisorbed material at the surface of the aperture in accordance with one embodiment.

As shown in FIG. 3, as a result of the boron exposure, boron may be physisorbed at the aperture surface, as indicated at 16. In effect, the boron may be deposited monolayer by monolayer over dielectric materials, semiconductor materials, or metals. In accordance with one embodiment, the deposition may use an Applied Materials Centura atomic layer deposition chamber with diborane gas, at 300° C., flowed over the patterned structures. While only a single aperture 12 is shown, conventionally, a large number of such apertures may be filled at the same time.

The deposited amorphous boron layer is highly conformal and highly resistive and, therefore, is advantageous as a high aspect ratio aperture fill material.

Figure 6:
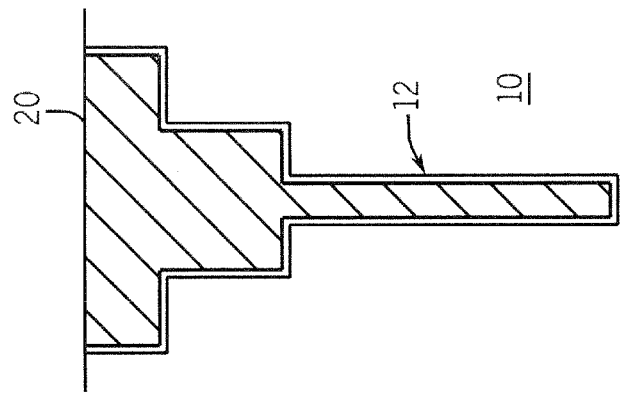
FIG. 6 is a greatly enlarged cross-section showing a filled aperture in accordance with one embodiment.
Figure 5:
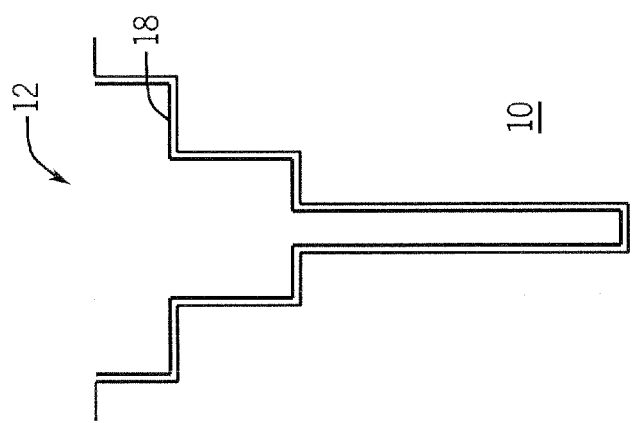
FIG. 5 is a greatly enlarged cross-section showing the first monolayer being formed in a high aspect ratio aperture in accordance with one embodiment.
Figure 4:
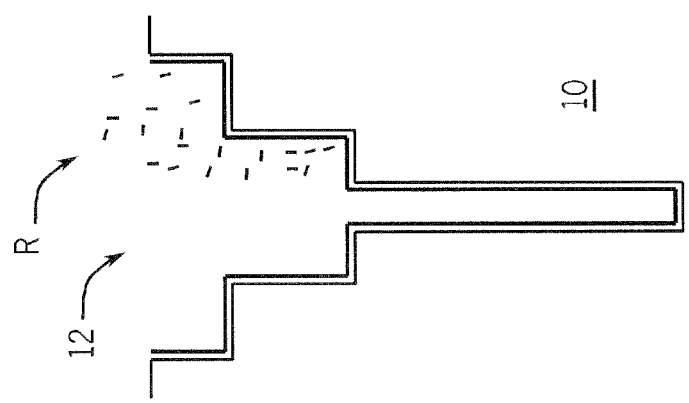
FIG. 4 is a greatly enlarged cross-section showing residues being pumped down in accordance with one embodiment.

Next, as shown in FIG. 4, the residues, indicated as R, may be pumped down. Then, as shown in FIG. 5, the first monolayer 18 has been deposited in the aperture 12. This process is repeated to form any number of monolayers until the aperture 12 is completely filled by a filler 20, as shown in FIG. 6. After filling, the semiconductor substrate 10 may be planarized in some embodiments. The boron filler 20 may be entirely amorphous boron in some embodiments.

In some embodiments, the deposited boron is amorphous, which adds to its resistivity. The boron layer may be a continuous layer in some embodiments. In some cases, it is possible that there is intermixing between the deposited boron and the surrounding substrate. Good adhesion can be achieved to silicon nitride in some embodiments.

The boron filled aperture isolation may be used, for example, to isolate regions within the memory array in a flash memory. It may also be used, as another example, to electrically separate the periphery from the memory array.

In some embodiments, larger or smaller void free trench isolation structures may be formed where the aperture or trench is a high aspect ratio trench or aperture. Embodiments of the present invention are applicable to filling apertures of a variety of depths, sizes and shapes.

Figure 7:
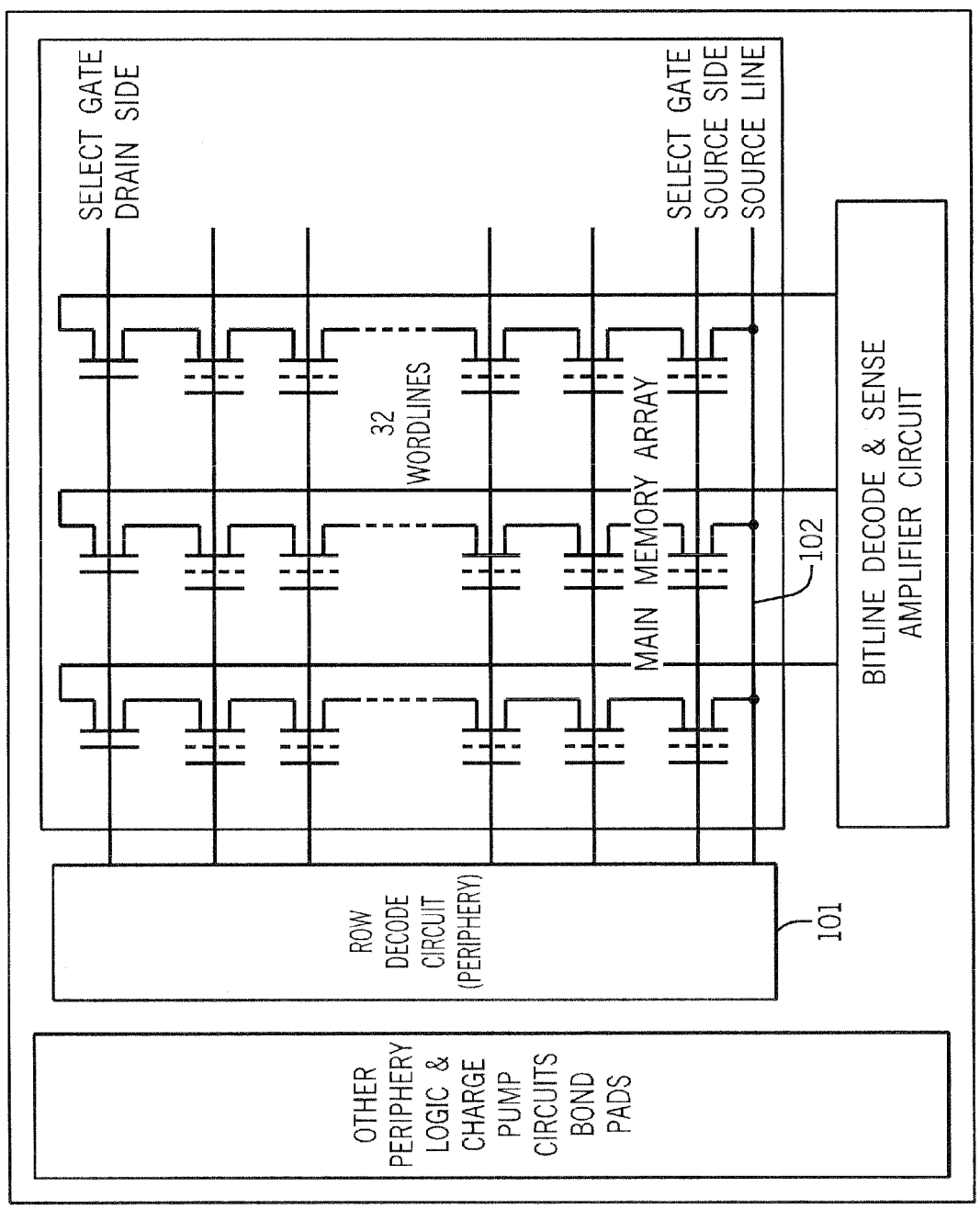
FIG. 7 is a schematic depiction of a memory in accordance with one embodiment.

FIG. 7 is a diagram of an exemplary flash memory device 416, employing an embodiment of the invention. Trench isolation structures conducted in accordance with some embodiments of the present invention may be formed to isolate a memory cell in the main memory array region 102 or to isolate the main memory array from the row decode circuitry, or periphery region 101, as another example.

Figure 8:
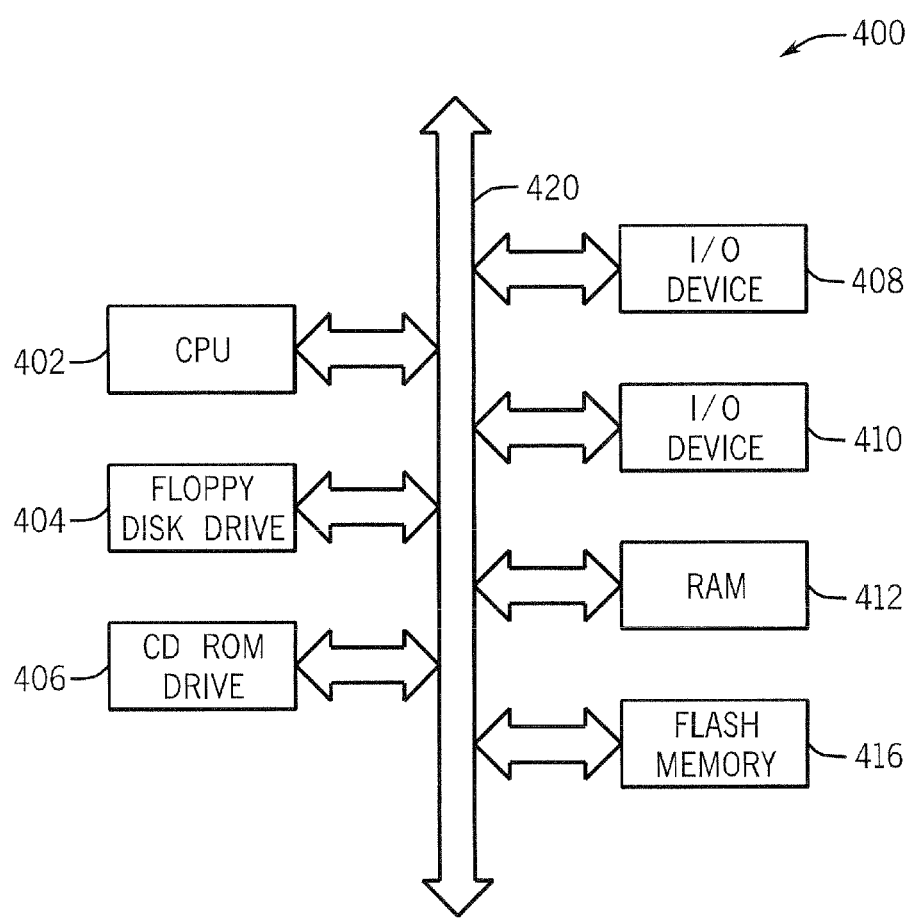
FIG. 8 is a schematic depiction of a system in accordance with one embodiment.

FIG. 8 is a block diagram of a processor-based system 400 using a flash memory device 416, constructed in accordance with an embodiment of the present invention. The flash memory device 416 may have cells separated by trench isolation regions constructed in accordance with an embodiment of the present invention. The processor-based system 400 may be a computer system, a cellular telephone, an appliance, a process control system, or any system employing a processor and the associated circuitry. The system 400 may include a central processing unit 402, such as a microprocessor, that communicates with the flash memory 416 and an input/output device 408 over a bus 420. The bus 420 may be a series of buses and bridges commonly used in a processor-based system, but, for convenience purposes only, the bus has been illustrated as a single bus. A second input/output device 410 is illustrated, but is not necessary to practice the invention. The processor-based system 400 may also include a random access memory (RAM) 412 and a read only memory (ROM) device (not shown), as well as peripheral devices, such as a floppy disk drive 404 and a compact disk drive 406 that communicate with the processor 412 over the bus 420.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming an electrically isolating aperture in a semiconductor substrate; and
   filling the aperture with a material consisting essentially of amorphous boron.

2. The method of claim 1 including using atomic layer deposition to fill the aperture with amorphous boron.

3. The method of claim 1 including forming a high aspect ratio aperture in said semiconductor substrate.

4. The method of claim 1 wherein forming an aperture includes forming a trench.

5. The method of claim 1 wherein filling the aperture includes forming a trench isolation.

6. A semiconductor device comprising:
   a substrate; and
   a filled isolation structure including a high aspect ratio aperture in said substrate, said aperture filled with a material consisting essentially of amorphous boron and configured to electrically isolate a first area from a second area of said semiconductor device.

7. The device of claim 6 wherein said aperture is a trench.

8. The device of claim 6 wherein said substrate is a semiconductor substrate.

9. The device of claim 6 wherein said device is a flash memory.

10. A method comprising:
    forming an electrical isolation trench in a semiconductor substrate; and
    using atomic layer deposition to fill said electrical isolation trench with a material consisting essentially of amorphous boron to form an isolation structure.

11. The method of claim 10 including using atomic layer deposition to fill the trench with amorphous boron.

12. A memory comprising:
    a semiconductor substrate;
    a high aspect ratio trench electrical isolation structure filled with a material consisting essentially of amorphous boron in said semiconductor substrate; and
    memory devices formed in said semiconductor substrate.

13. The memory of claim 12 wherein said trench has an aspect ratio of greater than ten.

14. The memory of claim 12 wherein said memory is a flash memory.

15. The method of claim 1 wherein filling the aperture with amorphous boron comprises exposing the aperture to a flow of diborane.

16. The method of claim 1 wherein filling the aperture with amorphous boron comprises depositing a monolayer of amorphous boron in the aperture.

17. The method of claim 1 wherein filling the aperture with amorphous boron comprises filling the aperture monolayer by monolayer.

18. The semiconductor device of claim 6 wherein the boron comprises a continuous layer of amorphous boron.

19. The method of claim 10 wherein using atomic layer deposition to fill said trench comprises forming a monolayer of amorphous boron on said trench.

20. The memory of claim 12 wherein the amorphous boron comprises a continuous layer of amorphous boron.

* * * * *